United States Patent [19]

Hall

[11] 4,214,253

[45] Jul. 22, 1980

[54] RADIATION DETECTOR

[75] Inventor: Robert N. Hall, Schenectady, N.Y.

[73] Assignee: General Electric Company, Schenectady, N.Y.

[21] Appl. No.: 805,857

[22] Filed: Jun. 13, 1977

[51] Int. Cl.$^2$ .............................................. H01L 27/14
[52] U.S. Cl. ........................................ 397/29; 357/30; 357/20; 250/211 J
[58] Field of Search ............................ 357/30, 29, 20; 250/211 J

[56] References Cited

U.S. PATENT DOCUMENTS

| | | | |
|---|---|---|---|
| 2,770,761 | 11/1956 | Pfann | 317/235 |
| 3,036,234 | 5/1962 | Dacey | 313/105 |
| 3,546,459 | 12/1970 | Higotsberger | 250/83.3 |
| 3,612,959 | 10/1971 | Simon | 317/235 R |
| 3,976,508 | 8/1976 | Mlavsky | 136/89 |

*Primary Examiner*—Martin H. Edlow
*Attorney, Agent, or Firm*—Julius J. Zaskalicky; James C. Davis, Jr.; Marvin Snyder

[57] ABSTRACT

An elongated body of monocrystalline semiconductor material is provided with a first region of one conductivity type entirely enclosed within a second region of the opposite conductivity type. Ohmic contacts are made to ends of the elongated body.

9 Claims, 4 Drawing Figures

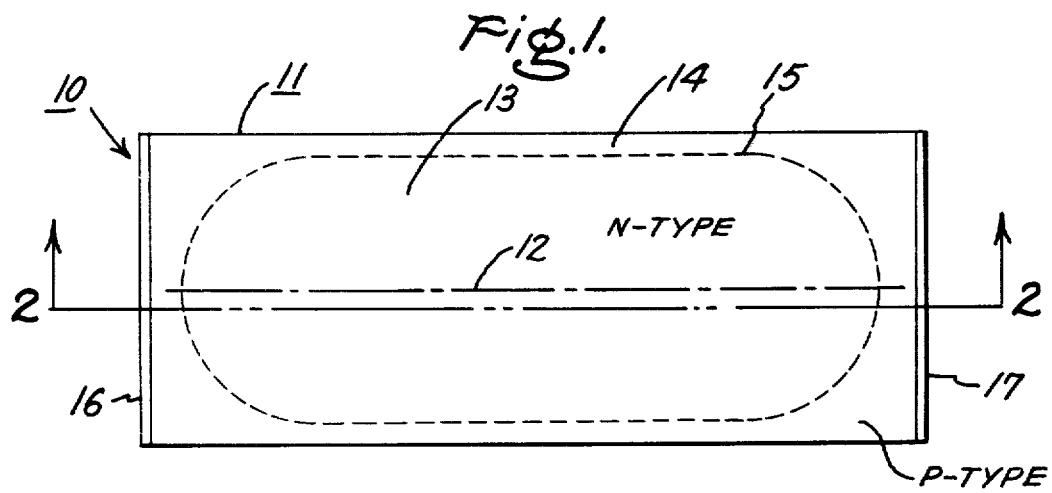
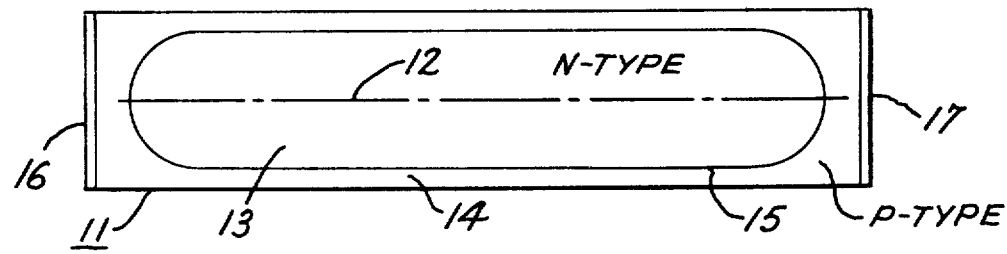
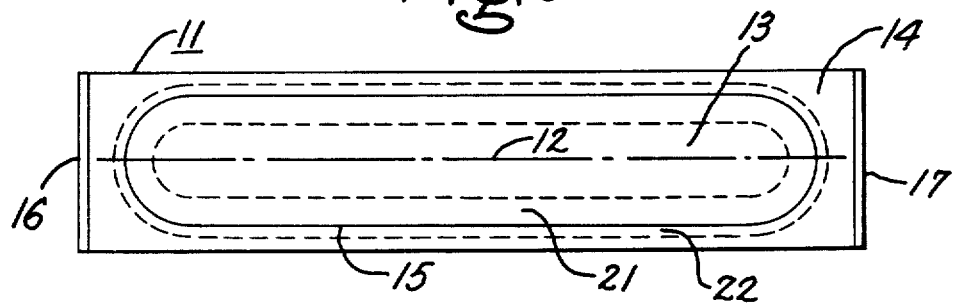
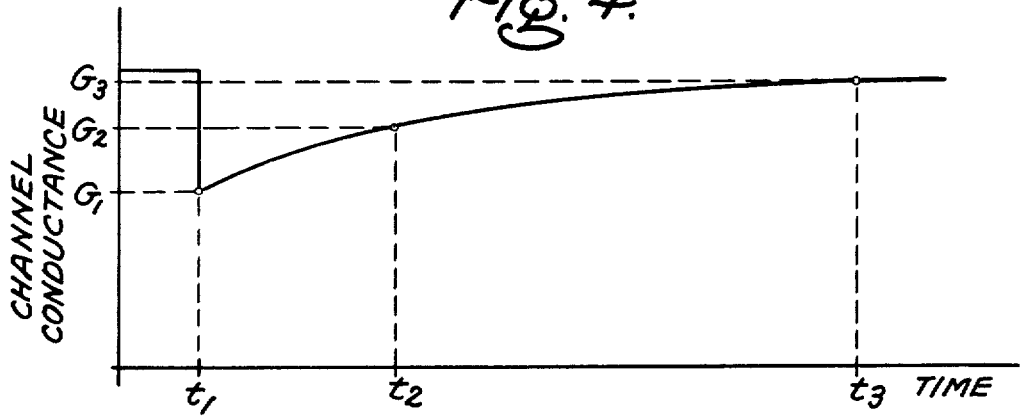

RADIATION DETECTOR

The present invention relates to radiation detectors for measuring ionizing radiation such as X-rays, gamma rays, visible light and the like.

An object of the present invention is to provide a simple, rugged and inexpensive radiation detector.

Another object of the present invention is to provide a radiation detector which has high sensitivity to ionizing radiation.

Another object of the present invention is to provide a solid state radiation detector which is compatible with solid state circuitry with regard to the operating parameters thereof.

A further object of the present invention is to provide a radiation detector which is capable of measuring both the intensity and the time integrated values of radiation.

In carrying out the invention in one illustrative embodiment thereof there is provided an elongated body of monocrystalline semiconductor material having a longitudinal axis. The body includes a first elongated-shaped region of one conductivity type located entirely within the body and generally conforming to the shape of the body. A second region of the body of opposite conductivity type completely surrounds the first region and forms a PN junction therewith completely contained within the body. A first ohmic contact is made to the second region at one end of the longitudinal axis of the body and a second ohmic contact is made to the second region at the other end of the longitudinal axis.

The novel features which are believed to be characteristic of the present invention are set forth with particularity in the appended claims. The invention, both as to its organization and method of operation, together with further objects and advantages thereof, may best be understood by reference to the following description taken in connection with the accompanying drawings wherein FIG. 1 is a plan view of a radiation detector in accordance with the present invention.

FIG. 2 is a sectional view of the radiation detector of FIG. 1 taken along section lines 2—2 showing the internal construction thereof.

FIG. 3 is a sectional view of the device of FIG. 1, identical to the sectional view of FIG. 2, showing depletion zones in the two regions produced by precharging the device preparatory to the utilization thereof as a detector of radiation.

FIG. 4 is a graph of channel conductance of the device of FIGS. 1 and 2 as a function of time useful in explaining the operation thereof.

Referring now to FIGS. 1 and 2, there is shown a radiation detector 10 made in accordance with the present invention. The device 10 includes a body 11 of monocrystalline silicon semiconductor material of elongated shape. The body is shown in the form of a rectangular bar having its long dimension parallel to the longitudinal axis 12 thereof and having dimensions in a plane perpendicular to the longitudinal axis 12 substantially smaller than the longitudinal dimension thereof. The body 11 may be constituted of any of a variety of semiconductor materials such as germanium, silicon, gallium arsenide, gallium phosphide, and gallium arsenide phosphide. Conveniently, the device 10 will be described in connection with utilization of silicon semiconductor material therefor and a body having a longitudinal dimension of 2 centimeters, a width of 5 millimeters, and a depth of 1 millimeter. Preferably, the longitudinal dimension is greater than twice the largest dimension transverse to the longitudinal axis. An elongated-shaped first region 13 of N-type conductivity generally conforming to the shape of the body is situated entirely within the body 11. A second region 14 of P-type conductivity completely surrounds the first region 13 and forms a PN junction 15 therewith which is completely contained within the body. A first ohmic or non-injecting contact 16 is made to the second region 14 at one end of the longitudinal axis 13 of the body and a second ohmic or non-injecting contact 17 is made to the second region 14 at the other end of the longitudinal axis 13. Such a device could be fabricated by starting with a bar of N-type semiconductor material having a resistivity of about 50 ohm centimeters, corresponding to a net activator concentration of about $10^{+14}$ activators per cubic centimeter. Thereafter, P-type activators from a suitable source, such as aluminum source could be diffused into the entire surface of the bar to form the P-type region 14 surrounding the N-type region 13. Conveniently, a surface concentration of net activators of about $10^{+16}$ activators per cubic centimeter could be used. The time and temperature of diffusion is set so that PN junction 15 is located at a depth beneath the surface which is about 10% of the depth dimension of the bar. The depth of the junction 15 should be no greater than a value at which the total number of net activators in the P-type region 14 is equal to or less than the total number of net activators in the N-type region 13 to provide a large dynamic range of conductance in the operation of the device. The electrodes 16 and 17 may be constituted of aluminum suitably alloyed to the ends of the P-type region 14 to provide ohmic connection thereto.

The operation of the device 10 of FIGS. 1 and 2 will now be explained in connection with FIGS. 3 and 4. The device 10 is biased or charged by applying a positive pulse voltage to the electrode 17 with respect to the electrode 16 for a short period of time. For the specific device described above a pulse of a 1000 volts for a few milliseconds would be suitable. When such a pulse is applied to the device 10, the portion of the P-type region 14 adjacent the contact 17 is positive and the PN junction 15 adjacent thereto is forward biased. Thus, the N-type region 13 becomes positively biased at a value substantially equal to 1000 volts. The pulse also establishes a potential gradient along the P-type region 14 between the contacts 16 and 17. Thus, the N-type region 13 becomes reversely biased with respect to the P-type region 14 along the PN junction 15 except in the vicinity of the contact 17 over which it is forward biased. During the occurrence of the pulse reverse biasing current flows to deplete carriers from both the N-type region 13 and the P-type region 14. On termination of the pulse, depletion zones 21 and 22 are established in the N-type region 13 and the P-type region 14, respectively, as shown in FIG. 3. As a portion of the P-type region adjoining PN junction 15 is now depleted of conduction carriers, the conductance between contacts 16 and 17 is decreased. The amount of the decrease in conductance would be dependent upon the amount of depletion of the P-type region and hence on the magnitude of the applied bias pulse. This value of reduced conductance is shown as $G_1$ at time $t_1$ in the graph of FIG. 4. The conductance of the device could be obtained by passing a small current ($10^{-5}$ Amperes) between contacts 16 and 17 and measuring the voltage drop in millivolts.

At room temperature thermally generated carriers discharge the reversely biased PN junction and thus cause the channel conductance to increase with time. At time $t_2$ the conductance has a value of $G_2$, and at time $t_3$ the conductance reaches a value of $G_3$ close to value of the conductance of the device prior to the time of application of the bias pulse. For a detector constituted of silicon at room temperature, the time period from $t_1$ and $t_3$ would be a few seconds. With the silicon body cooled to a temperature of 230° Kelvin, the time period $t_1$ to $t_3$, the time required for return of the detector to its substantially unbiased condition, would be about 10 hours. With external radiation, such as gamma rays, falling on the device, the graph of conductance versus time would rise more steeply. The difference in values of conductance at the times $t_1$ and $t_2$ is a measure of the radiation received by the device during the interval $t_1$ to $t_2$. The slope of the graph of conductance versus time at a particular point in time is a measure of the intensity of the received radiation, i.e., the rate at which radiation was received by the device. The conductance measurement described above could be done on an intermittent basis to determine the quantity of radiation received, or it could be done on a continuous basis to establish a series of points from which the intensity of radiation could be determined.

For a device constituted of germanium, the complete discharge condition would be reached sooner. Accordingly, to obtain the same thermal discharge time as for a silicon device, a lower temperature would have to be used. When a material, such as gallium phosphide which has a band gap about twice the band gap of silicon, is utilized in the device, the time period from time $t_1$ to $t_3$ for substantially complete discharge of the charge device from only thermal sources is many times the same time period for silicon at the same temperature. At room temperature the time required for the discharge of a gallium phosphide device would be measured in days instead of the few seconds mentioned above for silicon. Thus, devices constituted of gallium phosphide would be suitable for use as dosimeters for measuring radiation exposure.

While the invention has been described in specific embodiments, it will be understood that modifications may be made by those skilled in the art, and it is intended by the appended claims to cover all such modifications and changes as fall within the true spirit of the invention.

I claim:

1. A semiconductor device comprising:
    an elongated-shaped body of monocrystalline semiconductor material having a longitudinal dimension,
    said body including a first elongated-shaped region of a one conductivity type located entirely within and generally conforming to the shape of said body, and a second region of the opposite conductivity type completely enclosing said first region and forming a PN junction therewith completely contained within said body,
    a first ohmic contact to said second region at one end of said longitudinal dimension and a second ohmic contact to said second region at the other end of said longitudinal dimension.

2. The device of claim 1 in which the ratio of width of said second region to the width of said first region in a line orthogonal to said longitudinal dimension is substantially less than 1.

3. The device of claim 2 in which the total number of net activators in said second region is not large in comparison with the total number of net activators in said first region.

4. The device of claim 1 in which the largest transverse dimension of said elongated-shaped body in a plane orthogonal to said longitudinal dimension is substantially less than said longitudinal dimension.

5. The device of claim 4 in which said longitudinal dimension is greater than twice said transverse dimension.

6. The device of claim 1 in which said monocrystalline semiconductor material is selected from the class consisting of gallium phosphide, gallium arsenide, gallium arsenide phosphide, silicon and germanium.

7. The device of claim 1 in which said monocrystalline semiconductor material is gallium phosphide.

8. The device of claim 1 in which said monocrystalline semiconductor material is silicon.

9. The device of claim 1 in which said monocrystalline semiconductor material is germanium.

* * * * *